United States Patent
Wagatsuma et al.

(10) Patent No.: US 11,417,514 B2
(45) Date of Patent: Aug. 16, 2022

(54) FILM FORMING METHOD AND FILM FORMING APPARATUS

(71) Applicant: TOKYO ELECTRON LIMITED, Tokyo (JP)

(72) Inventors: Yuichiro Wagatsuma, Nirasaki (JP); Toyohiro Kamada, Hillsboro, OR (US); Shinichi Ike, Nirasaki (JP); Shuji Azumo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 197 days.

(21) Appl. No.: 16/815,672

(22) Filed: Mar. 11, 2020

(65) Prior Publication Data
US 2020/0294798 A1    Sep. 17, 2020

(30) Foreign Application Priority Data

Mar. 15, 2019   (JP) .............................. JP2019-048530

(51) Int. Cl.
| | |
|---|---|
| *H01L 21/02* | (2006.01) |
| *C23C 16/50* | (2006.01) |
| *C23C 16/52* | (2006.01) |
| *C23C 16/36* | (2006.01) |

(52) U.S. Cl.
CPC ........ *H01L 21/02126* (2013.01); *C23C 16/36* (2013.01); *C23C 16/50* (2013.01); *C23C 16/52* (2013.01); *H01L 21/0234* (2013.01); *H01L 21/02167* (2013.01); *H01L 21/02326* (2013.01)

(58) Field of Classification Search
None
See application file for complete search history.

(56) References Cited

U.S. PATENT DOCUMENTS

2019/0096660 A1*   3/2019   Nakatani ............... C23C 16/401
2020/0090930 A1*   3/2020   Hashimoto ....... C23C 16/45553

FOREIGN PATENT DOCUMENTS

| JP | 2018-41976 A | 3/2018 |
| KR | 1020170091528 A | 8/2017 |
| KR | 1020190025060 A | 3/2019 |
| WO | 2019012797 A1 | 1/2019 |

* cited by examiner

*Primary Examiner* — Asok K Sarkar
(74) *Attorney, Agent, or Firm* — Nath, Goldberg & Meyer; Jerald L. Meyer; Tanya E. Harkins

(57) ABSTRACT

There is provided a film forming method, including: forming a film containing silicon, carbon and nitrogen on a substrate in a first process; and oxidizing the film with an oxidizing agent containing a hydroxy group and subsequently supplying a nitriding gas to the substrate in a second process.

11 Claims, 5 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2019-048530, filed on Mar. 15, 2019, the entire contents of which are incorporated herein by reference.

TECHNICAL FIELD

The present disclosure relates to a film forming method and a film forming apparatus.

BACKGROUND

A silicon oxycarbonitride (SiOCN) film is known as a low dielectric constant film used as an interlayer insulating film disposed between wirings (for example, see Patent Document 1).

PRIOR ART DOCUMENT

Patent Documents

Patent Document 1: Japanese Laid-Open Patent Publication No. 2018-041976

SUMMARY

According to one embodiment of the present disclosure, there is provided a film forming method, including: forming a film containing silicon, carbon and nitrogen on a substrate in a first process; and oxidizing the film with an oxidizing agent containing a hydroxy group and subsequently supplying a nitriding gas to the substrate in a second process.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
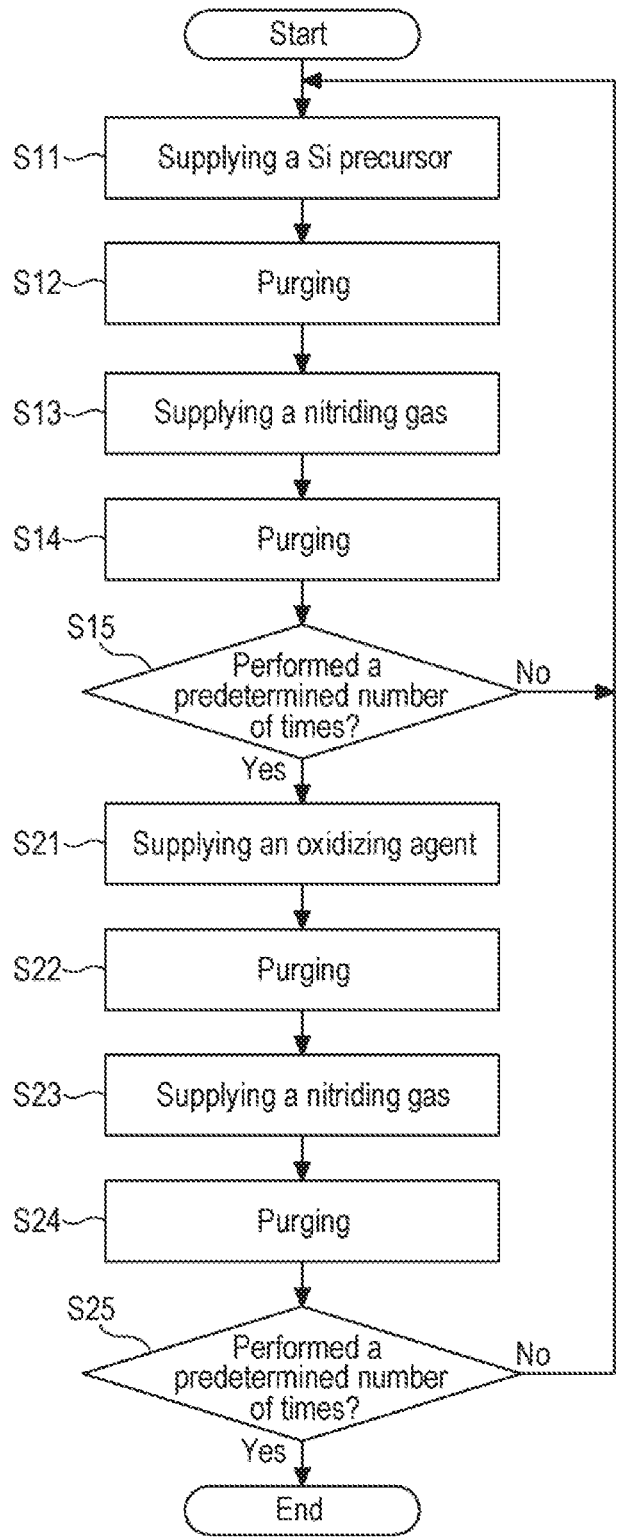
FIG. 1 is a flowchart showing an example of a film forming method according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In all the accompanying drawings, the same or corresponding members or components will be denoted by the same or corresponding reference numerals, and redundant explanations thereof will be omitted.

(Film Forming Method)

An example of a film forming method according to one embodiment will be described with reference to FIG. 1. FIG. 1 is a flowchart showing an example of the film forming method according to one embodiment.

First, as shown in step S11, a Si precursor, which is a raw material containing silicon (Si) and carbon (C), is supplied to a substrate. In one embodiment, a raw material gas containing silicon and carbon is supplied as a Si precursor to the substrate accommodated in a processing container. From the viewpoint of increasing Si—C bonds in a film to implement a low dielectric constant, it is preferable that the raw material gas containing silicon and carbon is a gas having Si—C bonds. As the gas having Si—C bonds, for example, $C_2H_4Cl_4Si_2$ (1,1,3,3-tetrachloro-1,3-disilacyclobutane) may be used. Furthermore, instead of the raw material gas containing silicon and carbon, a silicon-containing gas and a carbon-containing gas may be supplied simultaneously or sequentially as a Si precursor to the substrate accommodated in the processing container. As the silicon-containing gas, for example, a silicon hydride gas or a halogen-containing silicon gas may be used. As the carbon-containing gas, for example, ethylene or propylene may be used.

Subsequently, as shown in step S12, the interior of the processing container is purged by supplying a purge gas into the processing container. As the purge gas, for example, an inert gas such as argon (Ar), nitrogen ($N_2$) or the like may be used.

Subsequently, as shown in step S13, the Si precursor is nitrided by supplying a nitriding gas to the substrate. As the nitriding gas, for example, at least one gas selected from the group consisting of organic hydrazine compounds such as ammonia ($NH_3$), diazene ($N_2H_2$), hydrazine ($N_2H_4$), monomethylhydrazine ($CH_3(NH)NH_2$) and the like may be used. In addition, the nitriding gas may be formed into a plasma to perform a plasma nitridation.

Subsequently, as shown in step S14, the interior of the processing container is purged by supplying a purge gas into the processing container. As the purge gas, an inert gas such as Ar, $N_2$ or the like may be used as in step S12.

Subsequently, as shown in step S15, it is determined whether or not steps S11 to S14 have been executed a predetermined number of times. The predetermined number of times is determined according to a desired film thickness, and may be, for example, one time or at least two times. If it is determined in step S15 that steps S11 to S14 have been executed the predetermined number of times, the process proceeds to step S21. On the other hand, if it is determined in step S15 that steps S11 to S14 have not been executed the predetermined number of times, the process returns to step S11.

Through the above steps S11 to S15, a silicon carbonitride film (SiCN film) containing silicon (Si), carbon (C) and nitrogen (N) is formed on the substrate.

Subsequently, as shown in step S21, the SiCN film is oxidized to form a silicon oxycarbonitride film (SiOCN film) by supplying an oxidizing agent containing a hydroxy group (OH group) to the SiCN film formed in steps S11 to S15. As the oxidizing agent, for example, at least one gas selected from the group consisting of water ($H_2O$), hydrogen peroxide ($H_2O_2$), heavy water ($D_2O$) and an alcohol such as isopropyl alcohol (IPA) or the like may be used.

Subsequently, as shown in step S22, the interior of the processing container is purged by supplying a purge gas into the processing container. As the purge gas, an inert gas such as Ar, $N_2$ or the like may be used as in step S12.

Subsequently, as shown in step S23, a front surface of the SiOCN film is nitrided by supplying a nitriding gas to the substrate. As the nitriding gas, the same gas as used in step S13 may be used. However, the nitriding gas may be a gas different from that used in step S13.

Subsequently, as shown in step S24, the interior of the processing container is purged by supplying a purge gas into the processing container. As the purge gas, an inert gas such as Ar, $N_2$ or the like may be used as in step S12.

Subsequently, as shown in step S25, it is determined whether or not steps S21 to S24 have been executed a predetermined number of times. The predetermined number of times is determined according to a desired film thickness, and may be, for example, one time or at least two times. If it is determined in step S25 that steps S21 to S24 have been executed the predetermined number of times, the process ends. On the other hand, if it is determined in step S25 that steps S21 to S24 have not been executed the predetermined number of times, the process returns to step S11.

By the above steps S11 to S15 and the above steps S21 to S25, a SiOCN film having a desired film thickness and containing silicon (Si), carbon (C), nitrogen (N) and oxygen (O) is formed on the substrate.

Incidentally, as the method of forming the SiOCN film, a method of forming a SiCN film having a desired film thickness and then oxidizing the SiCN film with an oxidizing agent may be considered. However, in this case, if oxygen ($O_2$) is used as the oxidizing agent, the strong oxidizing power of oxygen may lower the concentration of carbon contained in the SiCN film, whereby the dielectric constant increases. If water ($H_2O$) having a weaker oxidizing power than oxygen is used as the oxidizing agent, the time required for oxidizing the SiCN film becomes longer, and the productivity decreases.

On the other hand, according to the film forming method of one embodiment, steps S21 to S24 are executed each time when steps S11 to S14 are executed the predetermined number of times. In other words, each time when a SiCN film having a predetermined film thickness is formed, the SiCN film is oxidized by an oxidizing agent containing a hydroxy group to form a SiOCN film. Thus, it is possible to suppress a decrease in concentration of carbon in the film and to form a SiOCN film having a low dielectric constant. Furthermore, it is possible to shorten the time required for oxidizing the SiCN film. That is, it is possible to form a low dielectric constant film with high productivity.

Furthermore, according to the film forming method of one embodiment, after oxidizing the SiCN film, the front surface of the SiOCN film is nitrided by supplying a nitriding gas. Thus, after forming the SiOCN film, the Si precursor may be adsorbed again onto the front surface of the SiOCN film. On the other hand, if the front surface of the SiOCN film is not nitrided after oxidizing the SiCN film, it is difficult to adsorb the Si precursor because OH groups have been formed on the front surface of the SiOCN film.

Figure 2:
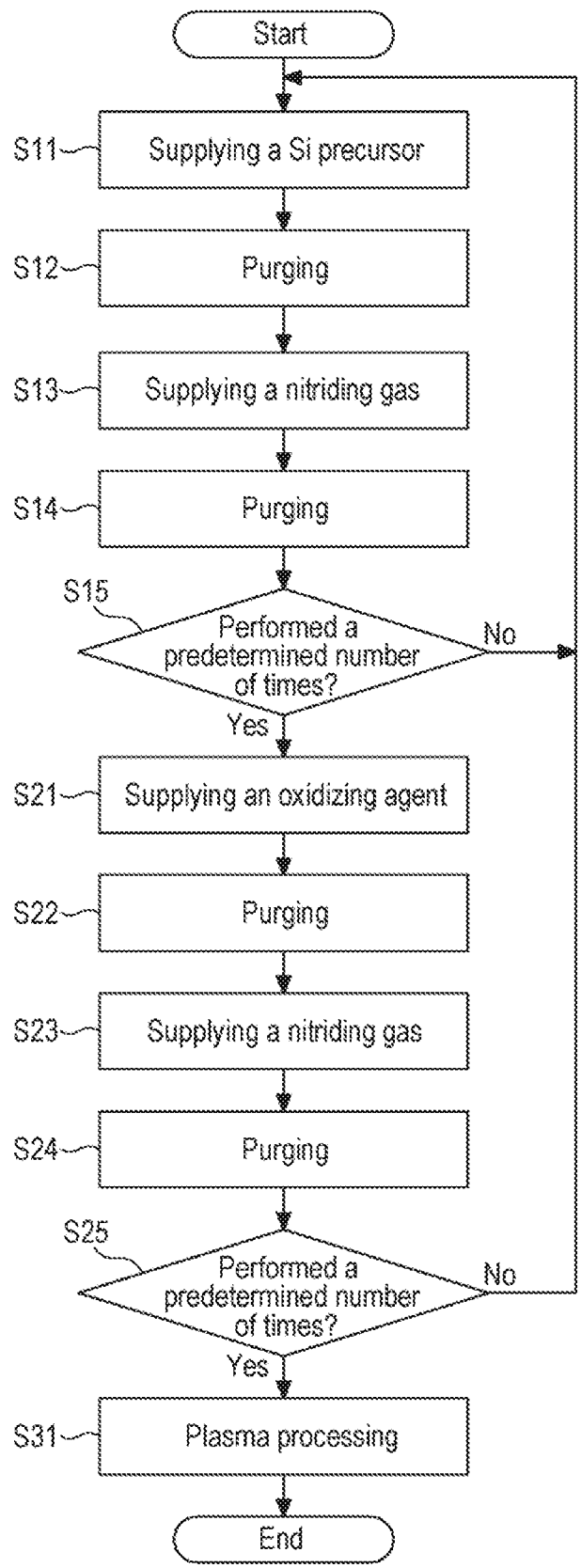
FIG. 2 is a flowchart showing another example of the film forming method according to one embodiment.

Another example of the film forming method of one embodiment will be described with reference to FIG. 2. FIG. 2 is a flowchart showing another example of the film forming method of one embodiment.

Another example of the film forming method of one embodiment differs from the film forming method shown in FIG. 1 in that, after forming the SiOCN film having a desired film thickness on the substrate by steps S11 to S15 and steps S21 to S25 shown in FIG. 1, plasma processing is performed on the SiOCN film. Steps S11 to S15 and steps S21 to S25 are the same as those of the example shown in FIG. 1. Therefore, description thereof is omitted.

As shown in step S31, the SiOCN film having a desired film thickness, which has been formed in steps S11 to S15 and steps S21 to S25, is subjected to the plasma processing using a hydrogen-containing gas. By performing the plasma processing on the SiOCN film using the hydrogen-containing gas, it is possible to improve the film density. In step S31, from the viewpoint of suppressing oxidation due to exposure to the atmosphere, it is preferable to perform the plasma processing without exposing the SiOCN film having a desired film thickness to the atmosphere. As the hydrogen-containing gas, for example, a hydrogen gas may be used. Although the example of the hydrogen gas-based plasma processing has been described, the gas used for the plasma processing may be an inert gas such as Ar, $N_2$ or the like, or a nitrogen-containing gas such as an $NH_3$ gas or the like.

Figure 3:
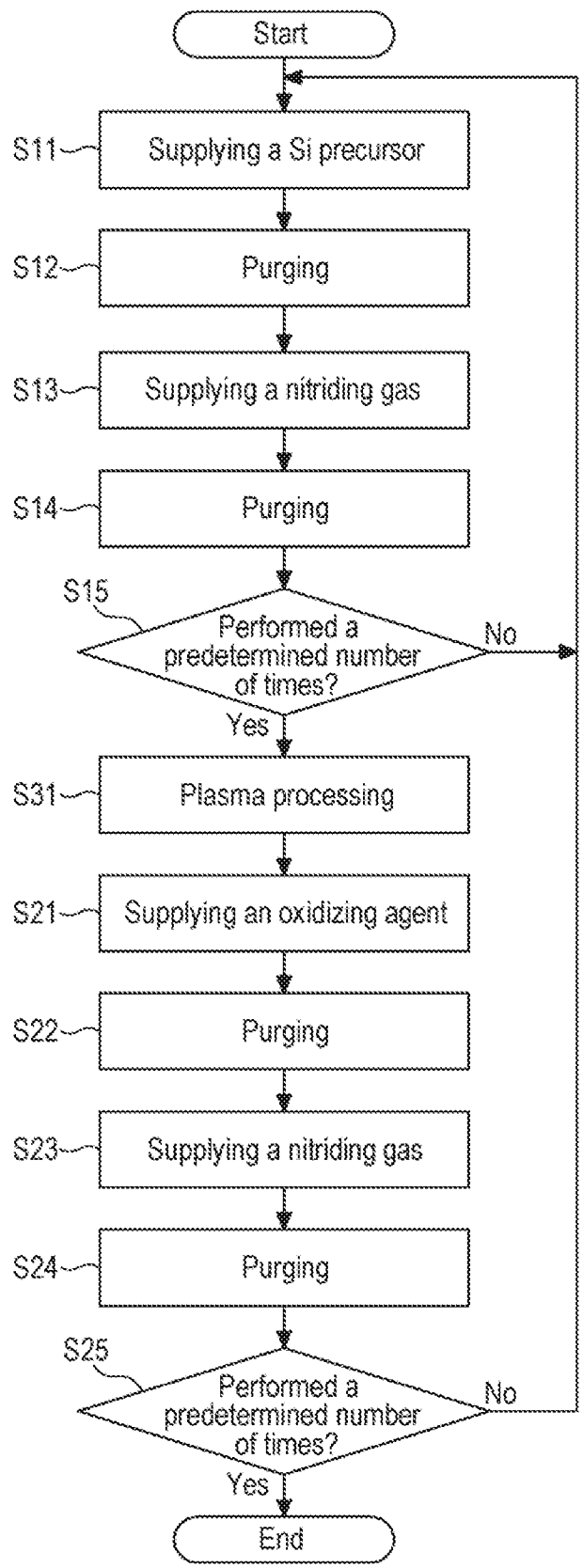
FIG. 3 is a flowchart showing a still another example of the film forming method according to one embodiment.

A still another example of the film forming method of one embodiment will be described with reference to FIG. 3. FIG. 3 is a flowchart showing the still another example of the film forming method of one embodiment.

The still another example of the film forming method of one embodiment differs from the film forming method shown in FIG. 1 in that, the plasma processing is performed on the SiCN film available after steps S11 to S15 shown in FIG. 1 and before steps S21 to S25 shown in FIG. 1. Steps S11 to S15 and steps S21 to S25 are the same as those of the example shown in FIG. 1. Therefore, description thereof is omitted.

As shown in step S31, the SiCN film formed in steps S11 to S15 is subjected to plasma processing using a hydrogen-containing gas. By performing the plasma processing on the SiCN film using the hydrogen-containing gas, it is possible to improve the film density. In step S31, as in the example shown in FIG. 2, it is preferable to perform the plasma processing without exposing the SiCN film to the atmosphere. As the hydrogen-containing gas, for example, a hydrogen gas may be used as in the example shown in FIG. 2. Although the example of the hydrogen gas-based plasma processing has been described, the gas used for the plasma processing may be an inert gas such as Ar, $N_2$ or the like, or a nitrogen-containing gas such as an $NH_3$ gas or the like.

Although the example in which the plasma processing is performed after steps S11 to S15 or after steps S21 to S25 has been described as the timing of performing the plasma processing, a more dense film may be formed by performing the plasma processing after steps S11 to S15 and after steps S21 to S25. In addition, the plasma processing may be performed between step S12 and step S13 or between step S22 and step S23.

[Film Forming Apparatus]

Figure 4:
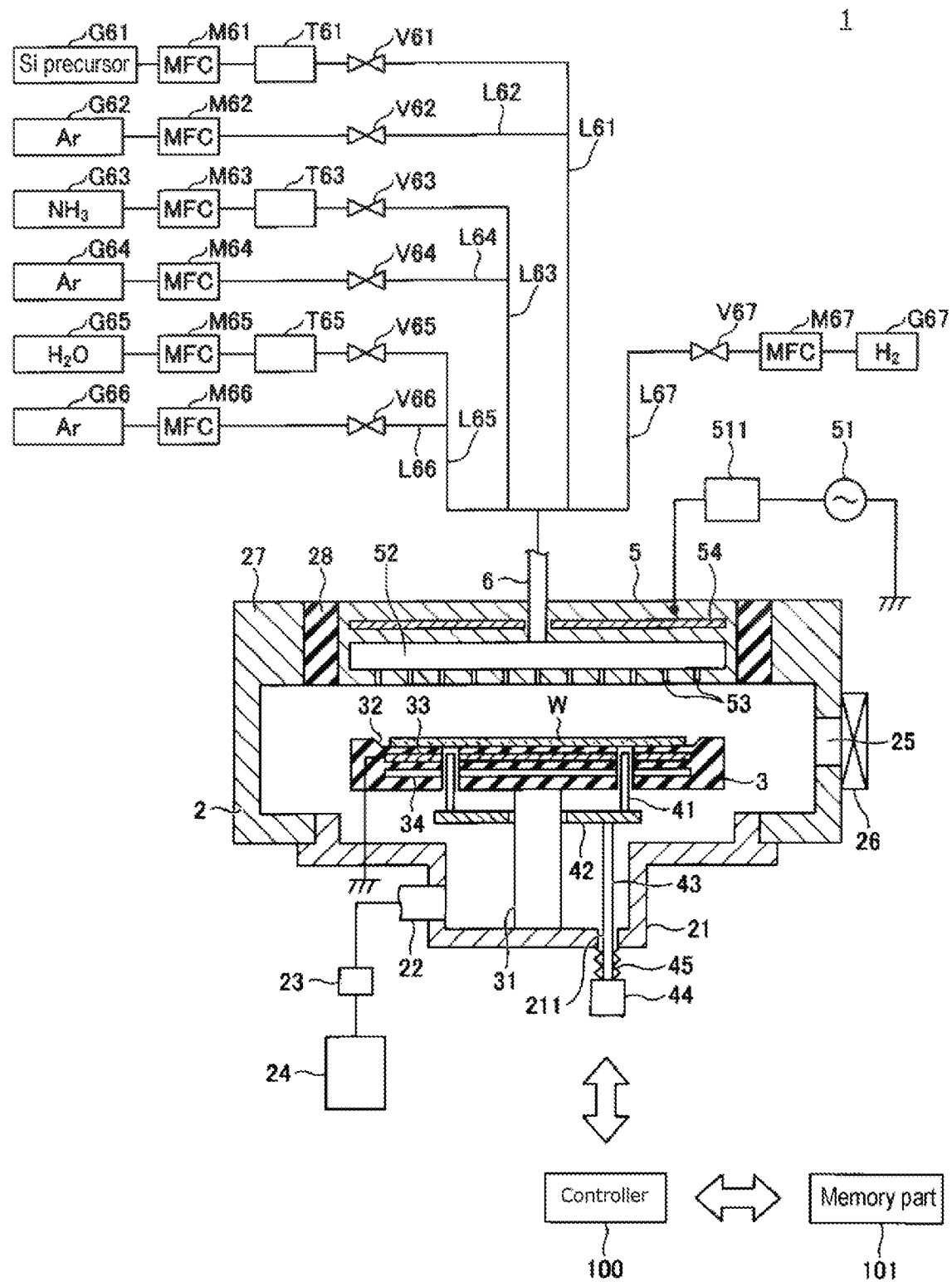
FIG. 4 is a view showing an exemplary configuration of a film forming apparatus according to one embodiment.

An example of a film forming apparatus that executes the film forming method of one embodiment will be described with reference to FIG. 4. FIG. 4 is a view showing an exemplary configuration of the film forming apparatus according to one embodiment.

As shown in FIG. 4, the film forming apparatus 1 is an apparatus that forms a SiOCN film on a semiconductor wafer (hereinafter referred to as "wafer W"), which is an example of a substrate.

The film forming apparatus 1 includes a substantially cylindrical airtight processing container 2. An exhaust chamber 21 is provided at the central portion of the bottom wall of the processing container 2.

The exhaust chamber 21 has, for example, a substantially cylindrical shape protruding downward. An exhaust pipe 22 is connected to the exhaust chamber 21, for example, on a side surface of the exhaust chamber 21.

An exhaust part 24 is connected to the exhaust pipe 22 via a pressure regulation part 23. The pressure regulation part 23 includes a pressure regulation valve such as a butterfly valve or the like. The exhaust pipe 22 is configured so that the interior of the processing container 2 can be depressurized by the exhaust part 24. A transfer port 25 is provided on a side surface of the processing container 2. The transfer port 25 is opened and closed by a gate valve 26. The loading and unloading of the wafer W between the processing container 2 and a transfer chamber (not shown) is performed through the transfer port 25.

A stage 3, which is a mounting table for holding the wafer W in a substantially horizontal posture, is provided inside the processing container 2. The stage 3 is formed in a substantially circular shape in a plan view, and is supported by a support member 31. On a front surface of the stage 3, for example, a substantially circular recess 32 for mounting the wafer W having a diameter of 300 mm thereon is formed. The recess 32 has an inner diameter much larger than the diameter of the wafer W. For example, the depth of the recess 32 is set to be substantially the same as the thickness of the wafer W. The stage 3 is formed of, for example, a ceramic material such as aluminum nitride (AlN) or the like. Furthermore, the stage 3 may be formed of a metallic material such as nickel (Ni) or the like. Alternatively, instead of the recess 32, a guide ring for guiding the wafer W may be provided on the peripheral edge portion of the front surface of the stage 3.

In the stage 3, for example, a grounded lower electrode 33 is embedded. A heating mechanism 34 is embedded below the lower electrode 33. The heating mechanism 34 heats the wafer W mounted on the stage 3 to a set temperature by being supplied with power from a power supply part (not shown) based on a control signal provided from a controller 100. In a case where the entire stage 3 is made of metal, the entire stage 3 functions as a lower electrode. Therefore, the lower electrode 33 does not have to be embedded in the stage 3. The stage 3 is provided with a plurality of (for example, three) lifting pins 41 for holding and raising or lowering the wafer W mounted on the stage 3. The material of the lifting pins 41 may be, for example, ceramics such as alumina ($Al_2O_3$) or the like, quartz, or the like. Lower ends of the lifting pins 41 are attached to a support plate 42. The support plate 42 is connected to an elevating mechanism 44 provided outside the processing container 2 via an elevating shaft 43.

The elevating mechanism 44 is installed, for example, below the exhaust chamber 21. A bellows 45 is provided between an opening 211 for the elevating shaft 43 formed in the lower surface of the exhaust chamber 21 and the elevating mechanism 44. The shape of the support plate 42 may be such a shape that the support plate 42 can be moved up and down without interfering with the support member 31 of the stage 3. The lifting pins 41 are configured to be able to move up and down between an upper portion above the front surface of the stage 3 and a lower portion on the front surface of the stage 3 by the elevating mechanism 44.

A gas supply part 5 is provided on a top wall 27 of the processing container 2 via an insulating member 28. The gas supply part 5 constitutes an upper electrode, and faces the lower electrode 33. A high-frequency power source 51 is connected to the gas supply part 5 via a matcher 511. By supplying high-frequency power from the high-frequency power source 51 to the upper electrode (the gas supply part 5), a high-frequency electric field is generated between the upper electrode (the gas supply part 5) and the lower electrode 33. The gas supply part 5 includes a hollow gas supply chamber 52. In a lower surface of the gas supply chamber 52, a large number of holes 53 for dispersedly supplying a processing gas into the processing container 2 therethrough are arranged, for example, uniformly. A heating mechanism 54 is buried in the gas supply part 5, for example, above the gas supply chamber 52. The heating mechanism 54 is heated to a set temperature by being supplied with power from a power supply part (not shown) based on a control signal provided from the controller 100.

The gas supply chamber 52 is provided with a gas supply path 6. The gas supply path 6 communicates with the gas supply chamber 52. Gas sources G61, G63, G65 and G67 are connected to the upstream side of the gas supply path 6 via gas lines L61, L63. L65 and L67, respectively.

The gas source G61 is a Si precursor gas source, and is connected to the gas supply path 6 via the gas line L61. In the gas line L61, a mass flow controller M61, a storage tank T61 and a valve V61 are provided in the named order from the side of the gas source G61. The mass flow controller M61 controls a flow rate of a Si precursor gas flowing through the gas line L61. The storage tank T61 may store the Si precursor gas supplied from the gas source G61 through the gas line L61 with the valve V61 kept in a closed state and may increase a pressure of the Si precursor gas in the storage tank T61. The valve V61 performs the supply and cutoff of the Si precursor gas with respect to the gas supply path 6 by the opening and closing operations thereof. The gas source G62 is connected to the gas line L61 at the downstream side of the valve V61 via the gas line L62.

The gas source G62 is an Ar gas source, and is connected to the gas line L61 via the gas line L62. In the gas line L62, a mass flow controller M62 and a valve V62 are provided in the named order from the side of the gas source G62. The mass flow controller M62 controls a flow rate of an Ar gas flowing through the gas line L62. The valve V62 performs the supply and cutoff of the Ar gas with respect to the gas line L61 by the opening and closing operations thereof.

The gas source G63 is an $NH_3$ gas source, and is connected to the gas supply path 6 via the gas line L63. In the gas line L63, a mass flow controller M63, a storage tank T63 and a valve V63 are provided in the named order from the side of the gas source G63. The mass flow controller M63 controls a flow rate of an $NH_3$ gas flowing through the gas line L63. The storage tank T63 may store the $NH_3$ gas supplied from the gas source G63 via the gas line L63 with the valve V63 kept in a closed state and may increase a pressure of the $NH_3$ gas inside the storage tank T63. The valve V63 performs the supply and cutoff of the $NH_3$ gas with respect to the gas supply path 6 by the opening and closing operations thereof. The gas source G64 is connected to the gas line L63 at the downstream side of the valve V63 via the gas line L64.

The gas source G64 is an Ar gas source, and is connected to the gas line L63 via the gas line L64. In the gas line L64, a mass flow controller M64 and a valve V64 are provided in the named order from the side of the gas source G64. The mass flow controller M64 controls a flow rate of an Ar gas flowing through the gas line L64. The valve V64 performs the supply and cutoff of the Ar gas with respect to the gas line L63 by the opening and closing operations thereof.

The gas source G65 is a $H_2O$ gas source, and is connected to the gas supply path 6 via the gas line L65. In the gas line L65, a mass flow controller M65, a storage tank T65 and a valve V65 are provided in the named order from the side of the gas source G65. The mass flow controller M65 controls a flow rate of a $H_2O$ gas flowing through the gas line L65. The storage tank T65 may store the $H_2O$ gas supplied from the gas source G65 via the gas line L65 with the valve V65 kept in a closed state and may increase a pressure of the $H_2O$ gas inside the storage tank T65. The valve V65 performs the supply and cutoff of the $H_2O$ gas with respect to the gas supply path 6 by the opening and closing operations thereof. The gas source G66 is connected to the gas line L65 at the downstream side of the valve V65 via the gas line L66.

The gas source G66 is an Ar gas source, and is connected to the gas line L65 via the gas line L66. In the gas line L66, a mass flow controller M66 and a valve V66 are provided in the named order from the side of the gas source G66. The mass flow controller M66 controls a flow rate of an Ar gas flowing through the gas line L66. The valve V66 performs the supply and cutoff of the Ar gas with respect to the gas line L65 by the opening and closing operations thereof.

The gas source G67 is a $H_2$ gas source, and is connected to the gas supply path 6 via the gas line L67. In the gas line L67, a mass flow controller M67 and a valve V67 are provided in the named order from the side of the gas source G67. The mass flow controller M67 controls a flow rate of a $H_2$ gas flowing through the gas line L67. The valve V67 performs the supply and cutoff of the $H_2$ gas with respect to the gas supply path 6 by the opening and closing operations thereof.

The film forming apparatus 1 includes the controller 100 and a memory part 101. The controller 100 includes a CPU, a RAM, a ROM and the like (all of which are not shown). The controller 100 entirely controls the film forming apparatus 1 by, for example, causing the CPU to execute a computer program stored in the ROM or the memory part 101. Specifically, the controller 100 causes the CPU to execute the control program stored in the memory part 101 to control the operations of the respective components of the film forming apparatus 1, thereby performing a film forming process, a plasma process and the like on the wafer W.

Figure 5:
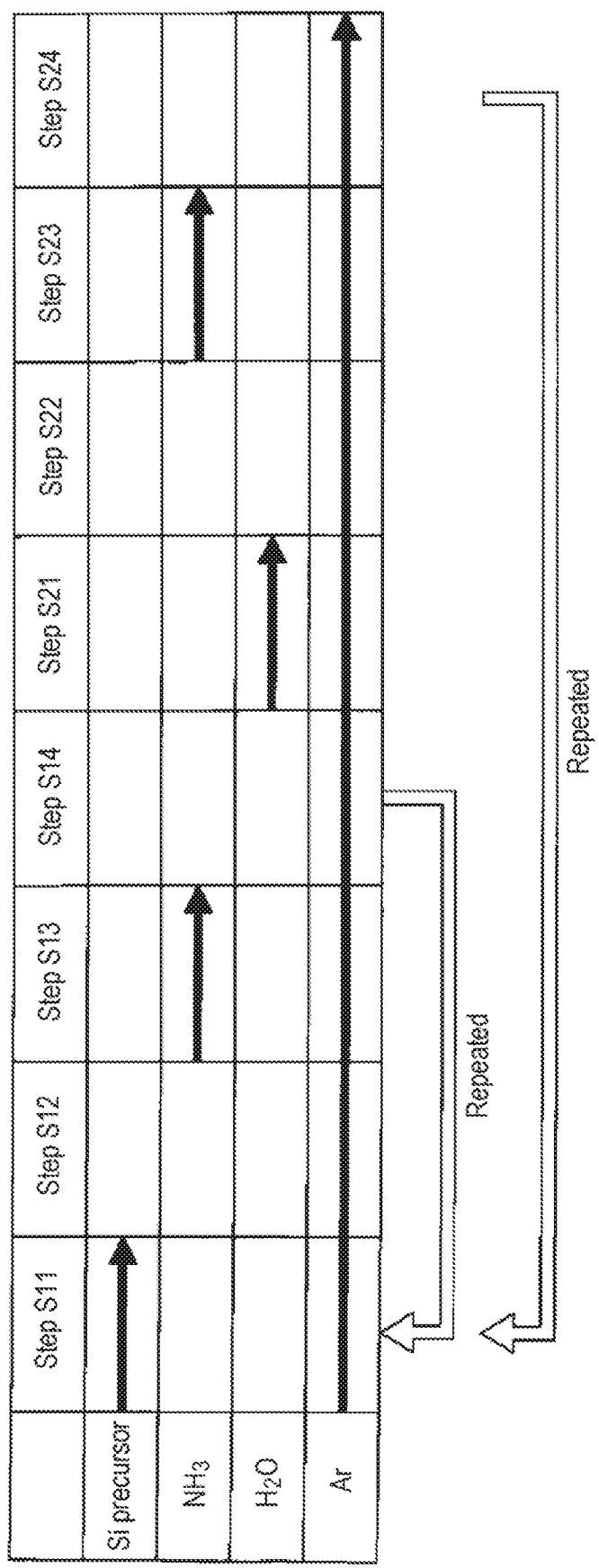
FIG. 5 is a view showing an example of a gas supply sequence.

A method for forming a SiOCN film using the above-described film forming apparatus 1 will be described with reference to FIGS. 4 and 5. The film forming method according to one embodiment is applied to, for example, forming a low dielectric constant film (low-k film) used as an interlayer insulating film disposed between wirings. FIG. 5 is a view showing an example of a gas supply sequence.

First, while keeping the valves V61 to V67 closed, the gate valve 26 is opened, and the wafer W is transferred into the processing container 2 by the transfer mechanism and placed on the stage 3. After retracting the transfer mechanism from the interior of the processing container 2, the gate valve 26 is closed. Subsequently, the wafer W is heated to a predetermined temperature by the heating mechanism 34 of the stage 3, and the internal pressure of the processing container 2 is regulated to a predetermined pressure by the pressure regulation part 23.

Subsequently, the valves V62, V64 and V66 are opened, and the Ar gas is supplied at a predetermined flow rate from the gas sources G62, G64 and G66 to the gas lines L62, L64 and L66, respectively. Furthermore, the Si precursor gas is supplied from the gas source G61 to the gas line L61 at a predetermined flow rate. Moreover, the $NH_3$ gas is supplied from the gas source G63 to the gas line L63 at a predetermined flow rate. At this time, since the valves V61 and V63 remain closed, the Si precursor gas and the $NH_3$ gas are stored in the storage tanks T61 and T63, respectively, whereby the internal pressure of the storage tanks T61 and T63 increase.

Subsequently, the valve V61 is opened, and the Si precursor gas stored in the storage tank T61 is supplied into the processing container 2 and is adsorbed onto the front surface of the wafer W (step S11). At this time, since the valves V62, V64 and V66 remain opened, the Ar gas is supplied into the processing container 2 together with the Si precursor gas.

After a lapse of a predetermined period of time from the opening of the valve V61, the valve V61 is closed. Thus, the supply of the Si precursor gas into the processing container 2 is stopped. At this time, since the valves V62, V64 and V66 remain opened, the Ar gas is supplied into the processing container 2, the Si precursor gas remaining in the processing container 2 is discharged to the exhaust pipe 22, and the internal atmosphere of the processing container 2 is changed from the atmosphere of the Si precursor gas to the atmosphere of the Ar gas (step S12). On the other hand, by closing the valve V61, the Si precursor gas supplied from the gas source G61 to the gas line L61 is stored in the storage tank T61, whereby the internal pressure of the storage tank T61 increases.

After a lapse of a predetermined period of time from the closing of the valve V61, the valve V63 is opened. Thus, the $NH_3$ gas stored in the storage tank T63 is supplied into the processing container 2 to nitride the Si precursor adsorbed onto the front surface of the wafer W (step S13). At this time, since the valves V62, V64 and V66 remain opened, the Ar gas is supplied into the processing container 2 together with the $NH_3$ gas.

After a lapse of a predetermined period of time from the opening of the valve V63, the valve V63 is closed. Thus, the supply of the $NH_3$ gas into the processing container 2 is stopped. At this time, since the valves V62, V64 and V66 remain opened, the Ar gas is supplied into the processing container 2, the $NH_3$ gas remaining in the processing container 2 is discharged to the exhaust pipe 22, and the internal atmosphere of the processing container 2 is changed from the atmosphere of the $NH_3$ gas to the atmosphere of the Ar gas (step S14). On the other hand, by closing the valve V63, the $NH_3$ gas supplied from the gas source G63 to the gas line L63 is stored in the storage tank T63, whereby the internal pressure of the storage tank T63 increases.

A cycle including the above-described steps S11 to S14 is performed once to form a thin SiCN unit film on the front surface of the wafer W. Then, the cycle including steps S11 to S14 is repeated a plurality of times to form the SiCN film having a predetermined film thickness.

Subsequently, the valve V67 is opened, and the $H_2O$ gas is supplied at a predetermined flow rate from the gas source G67 into the processing container 2 via the gas line L67 to oxidize the SiCN film (step S21). At this time, since the valves V62, V64 and V66 remain opened, the Ar gas is supplied into the processing container 2 together with the $H_2O$ gas.

After a lapse of a predetermined period of time from the opening of the valve V67, the valve V67 is closed. Thus, the supply of the $H_2O$ gas into the processing container 2 is stopped. At this time, since the valves V62, V64 and V66 remain opened, the Ar gas is supplied into the processing container 2, the $H_2O$ gas remaining in the processing container 2 is discharged to the exhaust pipe 22, and the internal atmosphere of the processing container 2 is changed from the atmosphere of the H$_2$O gas to the atmosphere of the Ar gas (step S22).

After a lapse of a predetermined period of time from the closing of the valve V67, the valve V63 is opened. Thus, the NH$_3$ gas stored in the storage tank T63 is supplied into the processing container 2 to nitride the front surface of the SiOCN film (step S23). As a result, the OH groups formed on the front surface of the SiOCN film in step S21 are replaced with NH$_2$ groups. At this time, since the valves V62, V64 and V66 remain opened, the Ar gas is supplied into the processing container 2 together with the NH$_3$ gas.

After a lapse of a predetermined period of time from the opening of the valve V63, the valve V63 is closed. Thus, the supply of the NH$_3$ gas into the processing container 2 is stopped. At this time, since the valves V62, V64 and V66 remain opened, the Ar gas is supplied into the processing container 2, the NH$_3$ gas remaining in the processing container 2 is discharged to the exhaust pipe 22, and the internal atmosphere of the processing container 2 is changed from the atmosphere of the NH$_3$ gas to the atmosphere of the Ar gas (step S24). On the other hand, by closing the valve V63, the NH$_3$ gas supplied from the gas source G63 to the gas line L63 is stored in the storage tank T63, whereby the internal pressure of the storage tank T63 increases.

By performing the above steps S21 to S24, the SiCN film is oxidized to form a SiOCN film. Then, a cycle including steps S11 to S14 and steps S21 to S24 is repeated a plurality of times to form the SiOCN film having a desired film thickness.

Thereafter, the wafer W is unloaded from the processing container 2 in the order opposite to the order of loading the wafer W into the processing container 2.

In the example shown in FIG. 5, there has been described the case where steps S21 to S25 are performed once each time when steps S11 to S14 are repeated the predetermined number of times. However, steps S21 to S24 may be repeated a predetermined number of times each time when steps S11 to S14 are repeated the predetermined number of times.

[Example of Processing Conditions]

Next, an example of processing conditions used when forming the SiOCN film using the above-described film forming apparatus 1 will be described. In the following description, a processing temperature refers to the temperature of the stage 3, and a processing pressure refers to the internal pressure of the processing container 2.

An example of the processing conditions in step S11 is as follows.
 Flow rate of Si precursor gas: 2 to 100 sccm
 Flow rate of Ar gas: 100 to 6,000 sccm
 Processing time: 0.05 to 20 seconds
 Processing temperature: 200 to 500 degrees C.
 Processing pressure: 100 to 8,000 Pa An example of the processing conditions in step S12 is as follows.
 Flow rate of Ar gas: 100 to 6,000 sccm
 Processing time: 0.1 to 10 seconds An example of the processing conditions in step S13 is as follows.
 Flow rate of NH$_3$ gas: 100 to 10,000 sccm
 Flow rate of Ar gas: 100 to 6,000 sccm
 Processing time: 0.2 to 30 seconds
 Processing temperature: 200 to 500 degrees C.
 Processing pressure: 100 to 8,000 Pa An example of the processing conditions in step S14 is as follows.
 Flow rate of Ar gas: 100 to 6,000 sccm
 Processing time: 0.1 to 10 seconds An example of the processing conditions in step S15 is as follows.
 Predetermined number of times: 10 to 500 times An example of the processing conditions in step S21 is as follows.
 Flow rate of H$_2$O gas: 10 to 500 sccm
 Flow rate of Ar gas: 100 to 6,000 sccm
 Processing time: 1 to 60 seconds
 Processing temperature: 200 to 500 degrees C.
 Processing pressure: 100 to 8,000 Pa An example of the processing conditions in step S22 is as follows.
 Flow rate of Ar gas: 100 to 6,000 sccm
 Processing time: 0.1 to 1,000 seconds An example of the processing conditions in step S23 is as follows.
 Flow rate of NH$_3$ gas: 1,000 to 9,000 sccm
 Flow rate of Ar gas: 100 to 6,000 sccm
 Processing time: 0.1 to 5 seconds
 Processing temperature: 200 to 500 degrees C.
 Processing pressure: 100 to 8,000 Pa An example of the processing conditions in step S24 is as follows.
 Flow rate of Ar gas: 100 to 6,000 sccm
 Processing time: 0.1 to 5 seconds An example of the processing conditions in step S25 is as follows.
 Predetermined number of times: 1 to 100 times

EXAMPLES

Next, Examples were performed to confirm the effects of the film forming method according to one embodiment will be described.

In Example 1, by setting the predetermined number of times in step S15 to 40 times and the predetermined number of times in step S25 to 5 times in the above-described film forming method shown in FIG. 1, a SiOCN film having a thickness of about 20 nm was formed on the silicon wafer. In addition, 1,1,3,3-tetrachloro-1,3-disilacyclobutane represented by the following structural formula (1) was used as a Si precursor, the NH$_3$ gas was used as a nitriding gas, and the H$_2$O gas was used as an oxidizing agent.

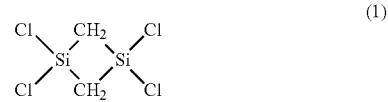

(1)

In Example 2, by setting the predetermined number of times in step S15 to 40 times and the predetermined number of times in step S25 to 6 times in the above-described film forming method shown in FIG. 2, a SiOCN film having a thickness of about 20 nm was formed on the silicon wafer. The processing conditions of steps S11 to S15 and steps S21 to S25 are the same as those of Example 1. The same gases as those of Example 1 were used as the Si precursor, the nitriding gas and the oxidizing agent. In step S31, the hydrogen gas-based plasma process was performed to form the SiOCN film having a thickness of about 20 nm.

In Comparative Example 1, steps S11 to S14 in the above-described film forming method shown in FIG. 1 were repeated 190 times to form a SiOCN film having a thickness of about 20 nm on the silicon wafer. Then, the SiOCN film was subjected to oxidation using an oxidizing agent for 50 minutes. The same gases as those of Example 1 were used as the Si precursor, the nitriding gas and the oxidizing agent.

Subsequently, the dielectric constant, the film density, the film composition and the processing time of the SiOCN films formed in Examples 1 and 2 and Comparative Example 1 were evaluated. In addition, a SiOCN film was formed on the silicon wafer having a recess formed on the surface thereof, and the step coverage was evaluated.

First, the dielectric constant of the SiOCN films formed in Examples 1 and 2 and Comparative Example 1 was measured by a mercury probe method. As a result, the dielectric constant of the SiOCN film formed in Example 1 was 3.3, the dielectric constant of the SiOCN film formed in Example 2 was 3.9, and the dielectric constant of the SiOCN film formed in Comparative Example 1 was 3.0. From these results, it can be noted that a SiOCN film having a low dielectric constant can be obtained in each of Examples 1 and 2 and Comparative Example 1.

Next, the film density of the SiOCN film formed in Example 2 and Comparative Example 1 was measured by an X-ray reflectivity (XRR) method. As a result, the film density of the SiOCN film formed in Example 2 was 2.1 g/cm$^3$, and the film density of the SiOCN film formed in Comparative Example 1 was 1.5 g/cm$^3$. From these results, it can be noted that the hydrogen gas-based plasma processing performed after the formation of the SiOCN film is effective in improving the film density of the SiOCN film.

Next, the concentrations of Si, O, N and C contained in the SiOCN films formed in Example 1 and Comparative Example 1 were measured by X-ray photoelectron spectroscopy (XPS). As a result, in Example 1, the Si concentration in the SiOCN film was 33.2 at %, the O concentration was 11.9 at %, the N concentration was 30.6 at %, and the C concentration was 24.2 at %. On the other hand, in Comparative Example 1, the Si concentration in the SiOCN film was 34.1 at %, the O concentration was 18.8 at %, the N concentration was 31.8 at %, and the C concentration was 15.3 at %. From these results, it can be seen that in Example 1, a SiOCN film having a higher C concentration than that in Comparative Example 1 can be formed. That is, it can be said that a decrease in the carbon concentration in the film can be suppressed by forming the SiOCN film by oxidizing the SiCN film with an oxidizing agent containing a hydroxy group each time when the SiCN film having a predetermined thickness is formed.

Next, the step coverage of the SiOCN films formed in Examples 1 and 2 was evaluated using a transmission electron microscope (TEM). As a result, in each of Examples 1 and 2, the SiOCN film was formed on the recess with good step coverage.

Next, in Examples 1 and 2 and Comparative Example 1, the time required to form a SiOCN film having a thickness of about 20 nm was compared. The time required to form a SiOCN film having a thickness of about 20 nm was about 37 minutes in Example 1, about 42 minutes in Example 2, and about 85 minutes in Comparative Example 1. From these results, it can be seen that in Examples 1 and 2, the time required to form the SiOCN film can be significantly reduced as compared with Comparative Example 1. That is, it can be said that in Examples 1 and 2, the productivity is improved as compared with Comparative Example 1.

In the above embodiment, steps S11 to S15 are an example of a first process, steps S21 to S24 are an example of a second process, and step S31 is an example of a third process.

It should be noted that the embodiments disclosed herein are exemplary in all respects and are not restrictive. The above-described embodiments may be omitted, replaced or modified in various forms without departing from the scope and spirit of the appended claims.

In the above embodiments, a single-wafer type apparatus that processes wafers one by one has been described as an example of the film forming apparatus. However, the present disclosure is not limited thereto. For example, the film forming apparatus may be a batch type apparatus that processes a plurality of wafers at a time. Furthermore, the film forming apparatus may be, for example, a semi-batch type apparatus for forming a film on each of a plurality of substrates by allowing the plurality of substrates to sequentially pass through an area to which a raw material gas is supplied and an area to which a reaction gas that reacts with the raw material gas is supplied while revolving the plurality of substrates disposed on a rotary table inside a processing container by the rotary table.

Furthermore, in the above embodiments, the case where the substrate is a semiconductor wafer has been described as an example. However, the present disclosure is not limited thereto. For example, the substrate may be a large substrate for a flat panel display (FPD), or a substrate for an EL element or a solar cell.

According to the present disclosure in some embodiments, it is possible to form a low dielectric constant film with high productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method, comprising:
    repeating a cycle a first predetermined number of times, the cycle including:
        repeating a first process a second predetermined number of times, the first process including forming a film containing silicon, carbon and nitrogen on a substrate; and
        performing a second process that includes:
            oxidizing the film with an oxidizing agent containing a hydroxy group; and
            subsequently nitriding the oxidized film by supplying a nitriding gas to the substrate.

2. The method of claim 1, wherein the first process includes supplying a raw material containing silicon and carbon to the substrate, and supplying a nitriding gas to the substrate.

3. The method of claim 2, wherein the supplying the raw material containing silicon and carbon to the substrate is at least one of supplying a raw material gas containing silicon and carbon to the substrate and supplying a silicon-containing gas and a carbon-containing gas to the substrate.

4. The method of claim 3, wherein the raw material gas containing silicon and carbon is a gas having a Si—C bond.

5. The method of claim 2, wherein the nitriding gas is at least one gas selected from a group consisting of $NH_3$, $N_2H_2$, $N_2H_4$ and an organic hydrazine compound.

6. The method of claim 1, further comprising:
performing a plasma process on the substrate without exposing the substrate to an atmosphere in a third process.

7. The method of claim 6, wherein a gas for performing the plasma process is at least one gas selected from a group consisting of a hydrogen-containing gas, an inert gas and a nitrogen-containing gas.

8. The method of claim 7, wherein the gas for performing the plasma process is at least one gas selected from a group consisting of $H_2$, $N_2$, Ar and $NH_3$.

9. The method of claim 1, wherein the nitriding gas is at least one gas selected from a group consisting of $NH_3$, $N_2H_2$, $N_2H_4$ and an organic hydrazine compound.

10. The method of claim 1, wherein the oxidizing agent is at least one gas selected from a group consisting of $H_2O$, $H_2O_2$, $D_2O$ and an alcohol.

11. A film forming apparatus, comprising:
a processing container in which a substrate is accommodated;
a gas supply part configured to supply a gas into the processing container; and
a controller,
wherein the controller controls the gas supply part so as to perform:
repeating a cycle a first predetermined number of times, the cycle including:
repeating a first process a second predetermined number of times, the first process including forming a film containing silicon, carbon and nitrogen on the substrate; and
performing a second process that includes:
oxidizing the film with an oxidizing agent containing a hydroxy group, and
subsequently nitriding the oxidized film by supplying a nitriding gas to the substrate.

\* \* \* \* \*